United States Patent
Chang et al.

(10) Patent No.: US 10,250,132 B2
(45) Date of Patent: Apr. 2, 2019

(54) VOLTAGE SYSTEM AND OPERATING METHOD THEREOF

(71) Applicant: NANYA TECHNOLOGY CORPORATION, New Taipei (TW)

(72) Inventors: Chuan-Jen Chang, Hsinchu County (TW); Ting-Shuo Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 89 days.

(21) Appl. No.: 15/619,056

(22) Filed: Jun. 9, 2017

(65) Prior Publication Data

US 2018/0358895 A1    Dec. 13, 2018

(51) Int. Cl.
  *H02M 3/07* (2006.01)
  *H03B 5/08* (2006.01)
  *H03K 3/03* (2006.01)

(52) U.S. Cl.
  CPC ............. *H02M 3/07* (2013.01); *H03B 5/08* (2013.01); *H03K 3/0315* (2013.01); *H03B 2200/0066* (2013.01); *H03B 2201/02* (2013.01)

(58) Field of Classification Search
  CPC ..................................................... H02M 3/07
  See application file for complete search history.

(56) References Cited

U.S. PATENT DOCUMENTS

| | | | | |
|---|---|---|---|---|
| 6,154,411 A * | 11/2000 | Morishita | ............... | G11C 5/145 365/189.09 |
| 2012/0230071 A1* | 9/2012 | Kaneda | ................. | H02M 3/073 363/59 |
| 2013/0093490 A1* | 4/2013 | Kim | ........................ | H02M 3/07 327/306 |
| 2015/0137773 A1* | 5/2015 | Miller | .................... | H02M 3/073 323/234 |

FOREIGN PATENT DOCUMENTS

| | | |
|---|---|---|
| TW | 201244344 A | 11/2012 |
| TW | 201509081 A | 3/2015 |
| TW | 201637336 A | 10/2016 |
| TW | M539182 U | 4/2017 |

\* cited by examiner

*Primary Examiner* — Jeffrey M Shin
(74) *Attorney, Agent, or Firm* — Muncy, Geissler, Olds & Lowe, P.C.

(57) ABSTRACT

A voltage system and a method of operating a voltage system are provided. The voltage system includes an oscillator and a pump device. The oscillator is configured to provide an oscillation signal exhibiting a first frequency when a voltage level of a supply voltage is greater than a reference voltage level, and to provide the oscillation signal exhibiting a second frequency greater than the first frequency when the voltage level of the supply voltage is less than the reference voltage level. The pump device is configured to provide the supply voltage, based on a frequency of the oscillation signal provided by the oscillator, by performing a charging operation.

14 Claims, 9 Drawing Sheets

VOLTAGE SYSTEM AND OPERATING METHOD THEREOF

TECHNICAL FIELD

The present disclosure relates to a voltage system and a method of operating a voltage system, and more particularly to a voltage system including an oscillator with an adjustable frequency.

DISCUSSION OF THE BACKGROUND

Voltage regulators (VRs) are generally used in power delivery applications in which an input voltage needs to be transformed to an output voltage in ratios that range from smaller than unity to greater than unity.

This Discussion of the Background section is provided for background information only. The statements in this Discussion of the Background are not an admission that the subject matter disclosed in this section constitutes prior art to the present disclosure, and no part of this section may be used as an admission that any part of this application, including this Discussion of the Background section, constitutes prior art to the present disclosure.

SUMMARY

One aspect of the present disclosure provides a voltage system. The voltage system includes an oscillator and a pump device. The oscillator is configured to provide an oscillation signal exhibiting a first frequency when a voltage level of a supply voltage is greater than a reference voltage level, and provide the oscillation signal exhibiting a second frequency greater than the first frequency when the voltage level of the supply voltage is less than the reference voltage level. The pump device is configured to provide the supply voltage, based on a frequency of the oscillation signal provided by the oscillator, by performing a charging operation.

In some embodiments, the frequency of the oscillation signal and the reference voltage level have a negative correlation.

In some embodiments, duty cycle of the pump device and the reference voltage level have a negative correlation.

In some embodiments, the reference voltage level is a second reference voltage level, wherein the oscillator is deactivated when the voltage level of the supply voltage is greater than a first reference voltage level greater than the second reference voltage level.

In some embodiments, the oscillator provides the oscillation signal exhibiting the first frequency when the voltage level of the supply voltage is less than the first reference voltage level and greater than the second reference voltage level.

In some embodiments, the voltage system further includes a sensing device configured to compare the voltage level of the supply voltage to the reference voltage level. The oscillator is configured to provide the oscillation signal exhibiting the second frequency when the comparison result from the sensing device indicates that the voltage level of the supply voltage is less than the reference voltage level.

In some embodiments, the oscillator is configured to receive the comparison result from the sensing device.

In some embodiments, the sensing device is a second sensing device and the reference voltage level is a second reference voltage level. The voltage system further includes a first sensing device configured to compare the voltage level of the supply voltage to a first reference voltage level greater than the second reference voltage level. The oscillator is configured to provide the oscillation signal exhibiting the first frequency when the sensing result from the first sensing device indicates that the voltage level of the supply voltage is less than the first reference voltage level, and the comparison result from the second sensing device indicates that the voltage level of the supply voltage is greater than the second reference voltage level.

In some embodiments, the oscillator is configured to receive the comparison result from the first sensing device.

Another aspect of the present disclosure provides a voltage system. The voltage system includes a first oscillator, a second oscillator, and a pump device. The first oscillator, which has one fixed frequency, is configured to provide an oscillation signal exhibiting a first frequency when a voltage level of a supply voltage is greater than a reference voltage level. The second oscillator, which has one fixed frequency and is independent of the first oscillator, is configured to provide an oscillation signal exhibiting a second frequency greater than the first frequency when the voltage level of the supply voltage is less than the reference voltage level. The pump device is configured to provide the supply voltage, based on a frequency of an oscillation signal received, by performed a charging operation.

In some embodiments, the frequency of the oscillation signal received and the reference voltage level have a negative correlation.

In some embodiments, duty cycles of the pump device and the reference voltage level have a negative correlation.

In some embodiments, the second oscillator is deactivated when the voltage level of the supply voltage is greater than the reference voltage level.

In some embodiments, the first oscillator is deactivated when the voltage level of the supply voltage is less than the reference voltage level.

In some embodiments, the voltage system further includes a sensing device configured to compare the voltage level of the supply voltage to the reference voltage level. The second oscillator is configured to provide the oscillation signal exhibiting the second frequency when the comparison result from the sensing device indicates that the voltage level of the supply voltage is less than the reference voltage level.

In some embodiments, the second oscillator is configured to receive the comparison result from the sensing device.

In some embodiments, the sensing device is a second sensing device and the reference voltage level is a second reference voltage level. The voltage system further includes a first sensing device configured to compare the voltage level of the supply voltage to a first reference voltage level greater than the second reference voltage level. The first oscillator is configured to provide the oscillation signal exhibiting the first frequency when the sensing result from the first sensing device indicates that the voltage level of the supply voltage is less than the first reference voltage level, and the comparison result from the second sensing device indicates that the voltage level of the supply voltage is greater than the second reference voltage level.

In some embodiments, the first oscillator is configured to receive the comparison result from the first sensing device.

Another aspect of the present disclosure provides a method of operating a voltage system. The method includes providing a pump device with an oscillation signal exhibiting a first frequency until a supply voltage provided by the pump device is less than a reference voltage level; and providing the pump device with the oscillation signal exhibiting a second frequency when the supply voltage is less than the reference voltage level.

In some embodiments, the method further includes determining whether the voltage level of the supply voltage is less than the reference voltage level.

In the present disclosure, a voltage system includes an oscillator, a pump device, a first sensing device and a second sensing device. The oscillator provides an oscillation signal exhibiting a relatively high frequency when comparison result from the second sensing device indicates that a voltage level of a supply voltage of the voltage system is less than a second reference voltage level. Because frequency of an oscillation signal relates to a time for increasing a voltage level of a supply voltage, when the pump device receives the oscillation signal exhibiting the relatively high frequency, a relatively short time is required for the pump device to increase the supply voltage from a drastically reduced voltage level back to a desired voltage level.

In contrast, in a comparative voltage system, the comparative voltage system includes a sensing device, an oscillator and a pump device. In a scenario, a supply voltage of the voltage system may drop drastically. In such scenario, the oscillator still provides an oscillation signal with the same frequency as in a circumstance that the voltage level of the supply voltage is slightly reduced, for example, from about 3.0V to about 2.8V. As previously mentioned, the frequency of the oscillation signal relates to a time for increasing the voltage level of the supply voltage. As a result, in that case a relatively long time is required to increase the supply voltage from a drastically reduced voltage level of about 1.5V back to a desired voltage level of about 3.0V.

The foregoing has outlined rather broadly the features and technical advantages of the present disclosure in order that the detailed description of the disclosure that follows may be better understood. Additional features and advantages of the disclosure are described hereinafter, and form the subject of the claims of the disclosure. It should be appreciated by those skilled in the art that the conception and specific embodiment disclosed may be readily utilized as a basis for modifying or designing other structures or processes for carrying out the purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
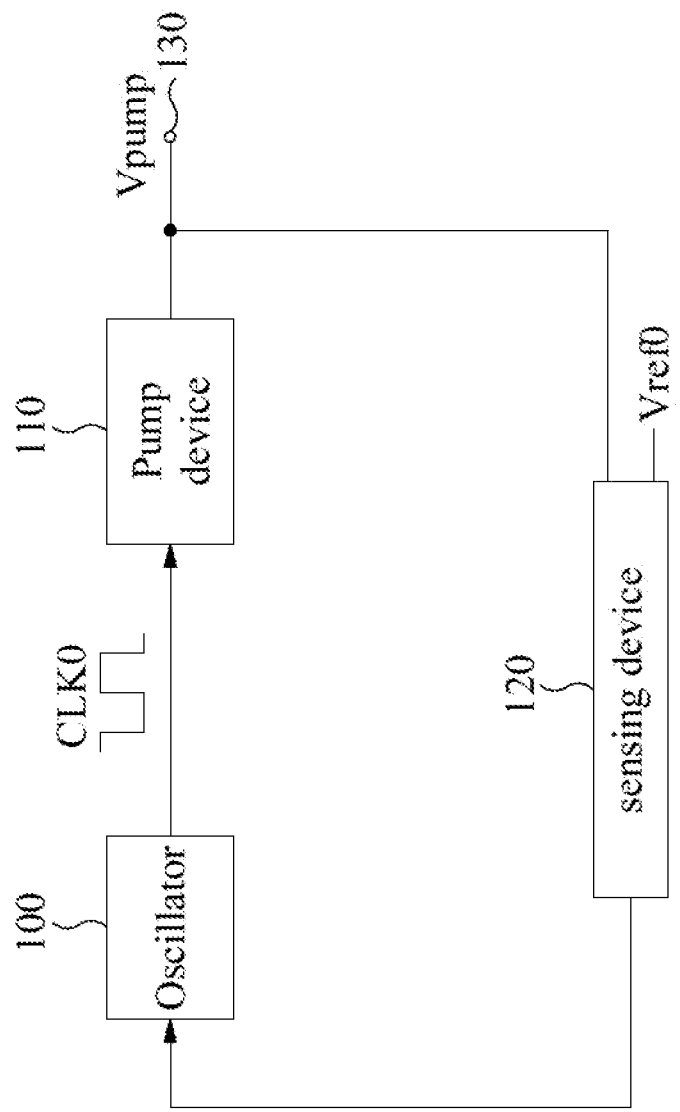
FIG. 1 is a block diagram of a comparative voltage system.

Embodiments, or examples, of the disclosure illustrated in the drawings are now described using specific language. It shall be understood that no limitation of the scope of the disclosure is thereby intended. Any alteration or modification to the described embodiments, and any further applications of principles described in this document, are to be considered as normally occurring to one of ordinary skill in the art to which the disclosure relates. Reference numerals may be repeated throughout the embodiments, but this does not necessarily require that feature(s) of one embodiment apply to another embodiment, even if they share the same reference numeral.

It shall be understood that when an element is referred to as being "connected to" or "coupled with" another element, it may be directly connected to or coupled to the other element, or intervening elements may be present.

It shall be understood that, although the terms first, second, third, etc. may be used herein to describe various elements, components, regions, layers or sections, these elements, components, regions, layers or sections should not be limited by these terms. Rather, these terms are merely used to distinguish one element, component, region, layer or section from another region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It shall be further understood that the terms "comprises" and "comprising," when used in this specification, specify the presence of stated features, integers, steps, operations, elements, or components, but do not preclude the presence or addition of one or more other features, integers, steps, operations, elements, components, or groups thereof.

FIG. 1 is a block diagram of a comparative voltage system 10. Referring to FIG. 1, the comparative voltage system 10 includes an oscillator 100, a pump device 110 and a sensing device 120.

The oscillator 100 functions to be either activated or deactivated by the sensing device 120, and provides the pump device 110 with an oscillation signal CLK0 when the oscillator is activated. In an embodiment, the oscillator 100 includes a voltage-controlled oscillator (VCO) or a digitally-controlled oscillator (DCO). In an embodiment, the oscillator 100 includes a ring oscillator. In an embodiment, the oscillator 100 includes an inductor-capacitor (LC) oscillator.

The pump device 100 functions to provide, in response to the oscillation signal CLK0, a supply voltage Vpump0 by performing a charging operation on a capacitor (not shown) coupled to an output 130 of the voltage system 10. In further detail, the pump device 110 charges the capacitor, thereby increasing the supply voltage Vpump0. In an embodiment, the supply voltage Vpump0 serves as a supply voltage of electrical components of a memory device including the voltage system 10. In an embodiment, the pump device 100 includes a regulator.

The sensing device 120 functions to compare the voltage level of the supply voltage Vpump0 to a reference voltage level Vref0, and determine whether the voltage level of the supply voltage Vpump0 is reduced based on the comparison result, thereby determining to activate or deactivate the oscillator 100. When the voltage level of the supply voltage Vpump0 is greater than the reference voltage Vref0, the sensing device 120 deactivates the oscillator 100. Alternatively, when the voltage level of the supply voltage Vpump0 is less than the reference voltage Vref0, the sensing device 120 activates the oscillator 100, thereby activating the pump device 110 to increase the voltage level of the supply voltage Vpump0.

In a scenario, the supply voltage Vpump0 of the voltage system 10 may drop drastically. For example, it is assumed that the supply voltage Vpump0 serves as a supply voltage for a load. When an operation mode of the load is changed from a light-load mode to a heavy-load mode, the supply voltage Vpump0 may drop drastically, for example, from about 3.0V to about 1.5V. In such scenario, the oscillator 100 still provides the oscillation signal CLK0 with the same frequency as in a circumstance that the voltage level of the supply voltage Vpump0 is only slightly reduced, for example, from about 3.0V to about 2.8V. Because frequency of the oscillation signal CLK0 is related to a time for increasing the voltage level of the supply voltage Vpump0, in that case a relatively long time is required to increase the supply voltage Vpump0 from a drastically reduced voltage level of about 1.5V back to a desired voltage level of about 3.0V.

Figure 2:
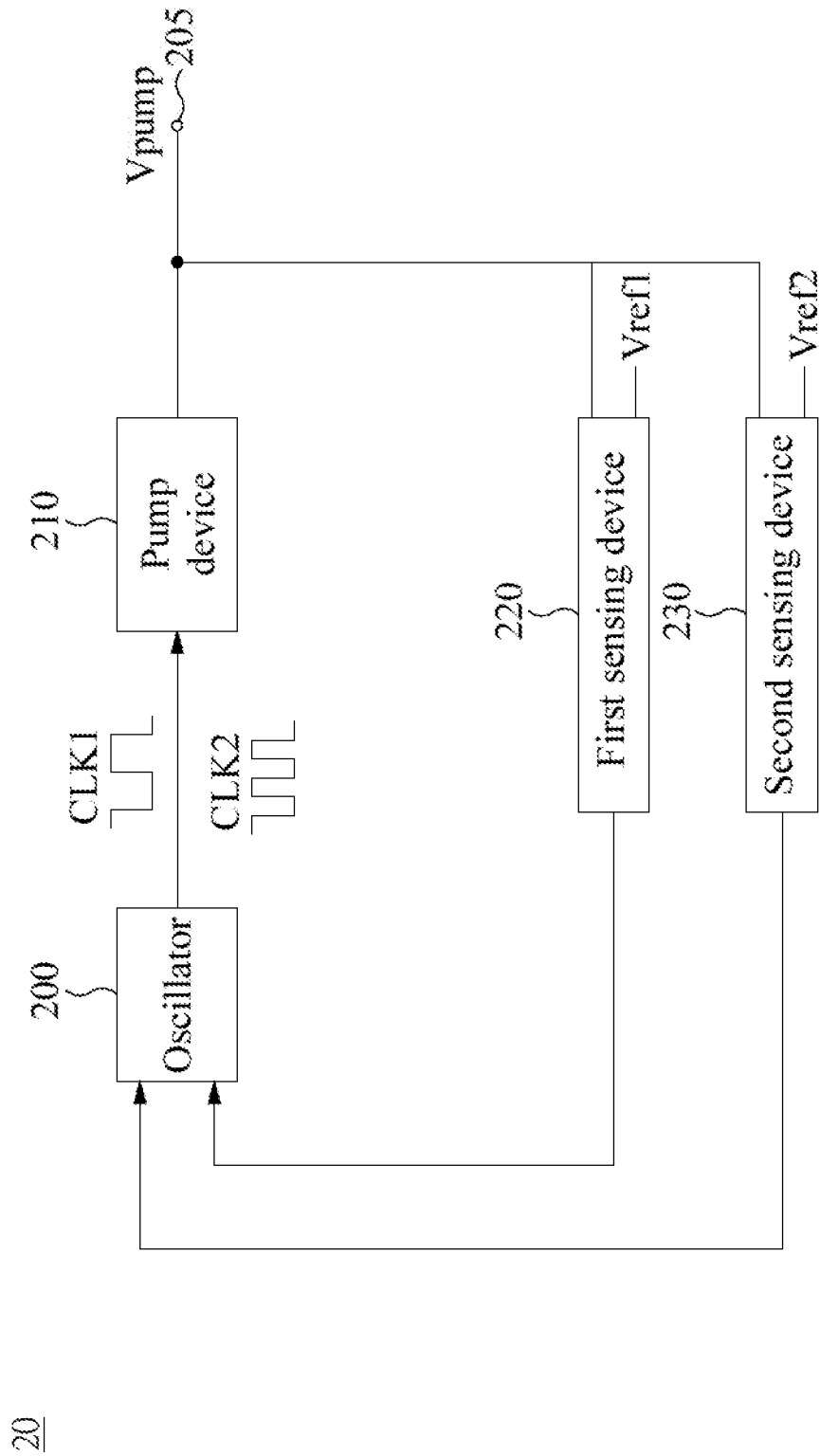
FIG. 2 is a block diagram of a voltage system, in accordance with an embodiment of the present disclosure.

FIG. 2 is a block diagram of an oscillator 200 of a voltage system 20, in accordance with an embodiment of the present disclosure. Referring to FIG. 2, in addition to the oscillator 200, the voltage system 20 further includes a pump device 210, a first sensing device 220, and a second sensing device 230.

The oscillator 200 functions to provide an oscillation signal exhibiting either a first frequency CLK1 or a second frequency CLK2 greater than the first frequency CLK1 when the oscillator 200 is activated, thereby decreasing time for increasing the voltage level of the supply voltage Vpump back to the desired voltage level, which will be described in detail with reference to FIGS. 3 and 4.

Moreover, the oscillator 200 includes the same operation performed by the oscillator 100 described and illustrated with reference to FIG. 1. In further detail, the oscillator 200 functions to be either activated or deactivated by the first sensing device 220, and provides the oscillation signal to the pump device 210 when the oscillator 200 is activated.

In an embodiment, the oscillator 100 includes a voltage-controlled oscillator (VCO) or a digitally-controlled oscillator (DCO). In an embodiment, the oscillator 100 includes a ring oscillator. In an embodiment, the oscillator 100 includes an inductor-capacitor (LC) oscillator.

The pump device 210 functions to provide the supply voltage Vpump, based on a frequency of the oscillation signal provided by the oscillator 200, by performing a charging operation on a capacitor (not shown) coupled to an output 205 of the voltage system 20, as will be further discussed below. In further detail, the pump device 210 charges the capacitor, thereby increasing the supply voltage Vpump. In an embodiment, the supply voltage Vpump serves as a supply voltage of electrical components of a memory device including the voltage system 20. In an embodiment, the pump device 210 includes a regulator.

The operation of the first sensing device 220 is substantially the same as the sensing device 120 described and illustrated with reference to FIG. 1. For convenience of discussion, the sensing device 120 of FIG. 1 is renamed and renumbered as the first sensing device 220; and the reference voltage level Vref0 of FIG. 1 is renamed as a first reference voltage level Vref1.

The second sensing device 230 functions to compare the voltage level of the supply voltage Vpump to a second reference voltage level Vref2 less than the first reference voltage level Vref1, and determines whether the voltage level of the supply voltage Vpump0 is reduced drastically based on the comparison result. In an embodiment, the first reference voltage level Vref1 is about 2.9V, and the second reference voltage level Vref2 is about 2.5V.

Figure 3:
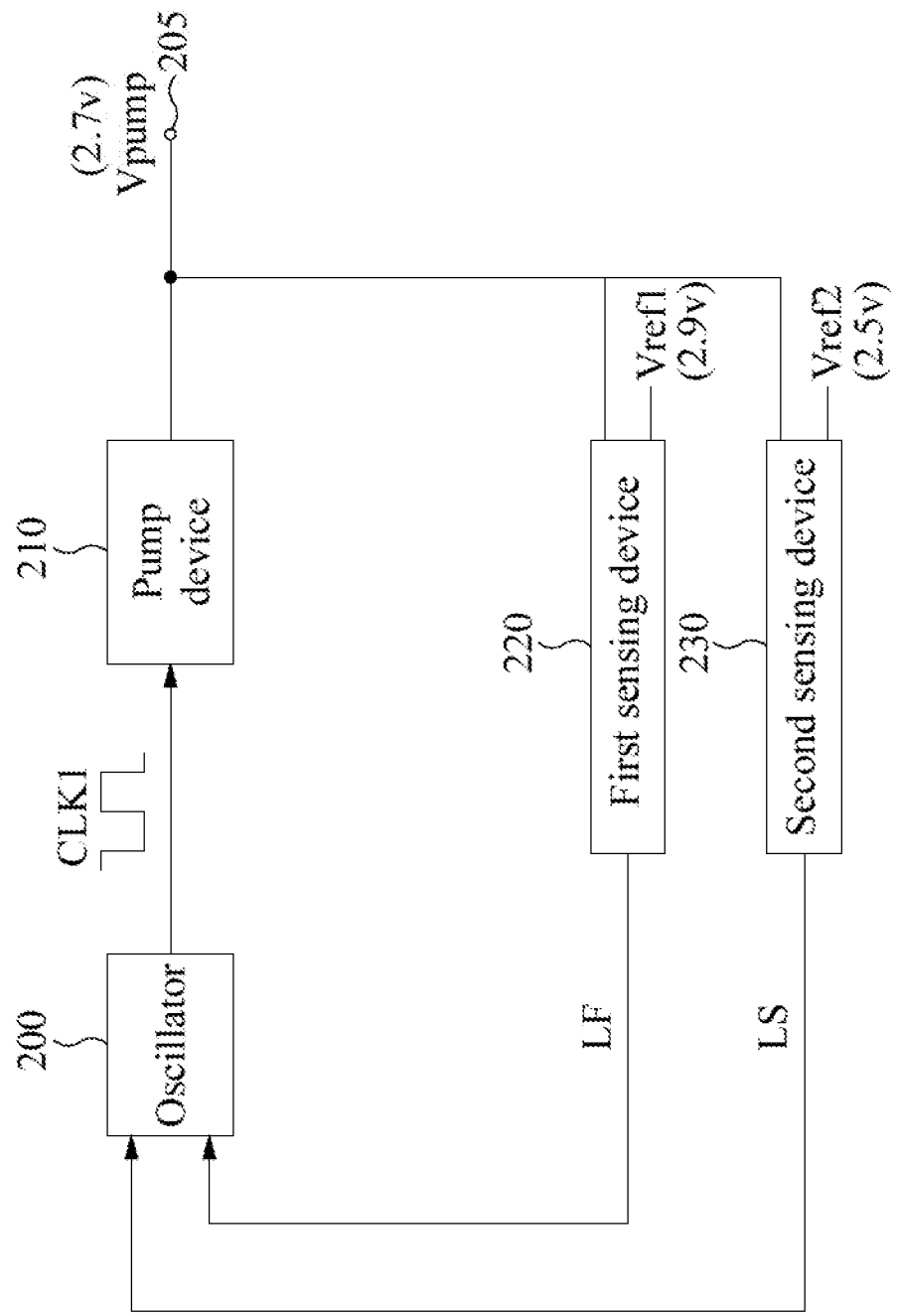
FIG. 3 is a block diagram illustrating an operation of the voltage system of FIG. 2, in accordance with an embodiment of the present disclosure.

FIG. 3 is a block diagram illustrating an operation of the voltage system 20 of FIG. 2, in accordance with an embodiment of the present disclosure. Referring to FIG. 3, a scenario in which the voltage level of the supply voltage Vpump is slightly reduced from the desired voltage level of about 3.0V to a voltage level of about 2.7V is illustrated. For the sake of describing the operation of FIG. 3, it is assumed that the first reference voltage level Vref1 is about 2.9V, and the second reference voltage level Vref2 is about 2.5V.

The first sensing device 220 compares the voltage level of about 2.7V to the first reference voltage level Vref1 of about 2.9V. Similarly, the second sensing device 230 compares the voltage level of about 2.7V to the second reference voltage level Vref2 of about 2.5V.

The oscillator 200 receives the comparison results LF and LS from the first sensing device 220 and the second sensing device 230. The oscillator 200 is activated by the first sensing device 220 when the sensing result from the first sensing device 220 indicates that the voltage level of about 2.7V is less than the first reference voltage level Vref1 of about 2.9V. Moreover, the oscillator 200 provides the oscillation signal exhibiting the first frequency CLK1 when the comparison result LS from the second sensing device 230 indicates that the voltage level of 2.7V is greater than the second reference voltage level Vref2 of 2.5V.

Alternatively, the oscillator 200 is deactivated when the voltage level of the supply voltage Vpump of, for example, 3.0V is greater than the first reference voltage level Vref1 of 2.9V.

Figure 4:
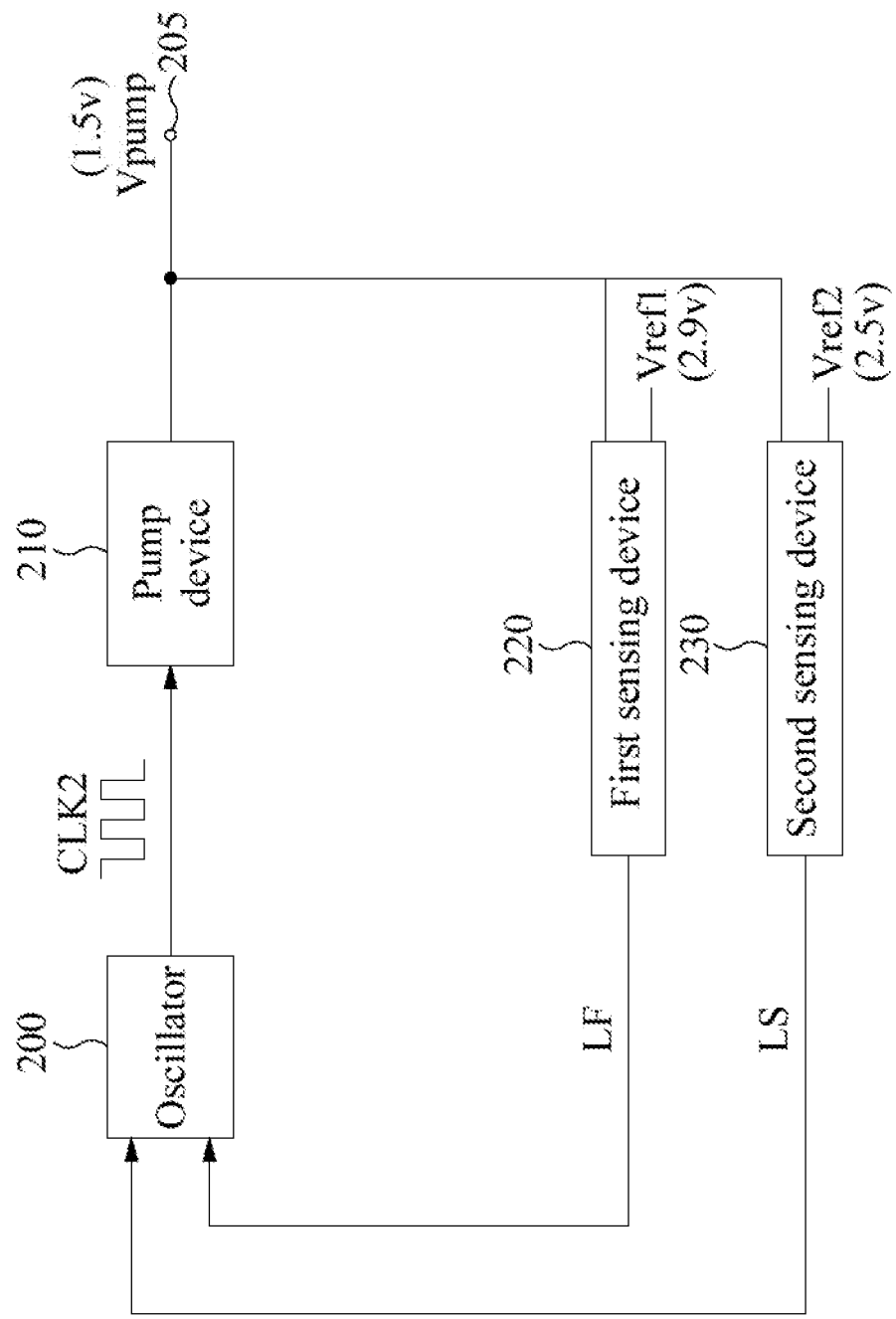
FIG. 4 is a block diagram illustrating another operation of the voltage system of FIG. 2, in accordance with an embodiment of the present disclosure.

FIG. 4 is a block diagram illustrating another operation of the voltage system 20 of FIG. 2, in accordance with an embodiment of the present disclosure. Referring to FIG. 4, a scenario in which the voltage level of the supply voltage Vpump is drastically reduced from the desired voltage level of about 3.0V to a voltage level of about 1.5V is illustrated. For the sake of describing the operation of FIG. 4, it is assumed that the first reference voltage level Vref1 is about 2.9V, and the second reference voltage level Vref2 is about 2.5V. In an example of the scenario, the supply voltage Vpump serves as a supply voltage for a load. When an operation mode of the load is changed from a light-load mode to a heavy-load mode, the supply voltage Vpump may drop drastically, for example, from about 3.0V to about 1.5V, which is less than not only the first reference voltage level Vref1 of about 2.9V but also the second reference voltage level Vref2 of 2.5V.

The first sensing device 220 compares the voltage level of about 1.5V to the first reference voltage level Vref1 of about 2.9V. Similarly, the second sensing device 230 compares the voltage level of about 1.5V to the second reference voltage level Vref2 of about 2.5V.

The oscillator 200 receives the comparison results LF and LF from the first sensing device 220 and the second sensing device 230. The oscillator 200 is activated by the first sensing device 220 when the sensing result LF from the first sensing device 220 indicates that the voltage level of about 1.5V is less than the first reference voltage level Vref1 of about 2.9V. Moreover, the oscillator 200 provides the oscillation signal exhibiting the relatively high second frequency CLK2 when the comparison result LS from the second sensing device 230 indicates that the voltage level of 1.5V is less than the second reference voltage level Vref2 of 2.5V.

Frequency of the oscillation signal relates to a time for increasing the voltage level of the supply voltage Vpump. For example, the frequency of the oscillation signal is associated with a duty cycle associated with the pump device 210. The duty cycle increases as the frequency increases. Accordingly, compared with receiving the relatively lower frequency, when the pump device 210 receives the relatively higher frequency, the pump device 210 charges the capacitor coupled to the output 205 for a relatively long time during a given period of time. As a result, a relatively short time is required to increase the drastically reduced voltage level back to the desired voltage level.

In view of this, when the pump device 210 receives the oscillation signal exhibiting the relatively high second frequency CLK2, a relatively short time is required for the pump device 210 to increase the supply voltage Vpump from a drastically reduced voltage level of about 1.5V back to a desired voltage level of about 3.0V.

Moreover, the second frequency CLK2 of the oscillation signal and the second reference voltage level Vref2 have a negative correlation. In further detail, in a design stage of the voltage system 20, the second frequency CLK2 of the oscillation signal can be designed to be higher when a voltage level of the second reference voltage Vref2 is designed to be lower. For example, in a first voltage system the voltage level of the second reference voltage Vref2 is designed as 2.0V, while the second frequency CLK2 is designed as 150 KHz. In a second voltage system, the voltage level of the second reference voltage Vref2 is designed as 2.5V, and the second frequency CLK2 is designed as 100 KHZ. Compared with the second voltage system, when the voltage level of the supply voltage Vpump of the first voltage system is decreased to about 1.5V, a relatively short time is required to increase the decreased voltage level of about 1.5V back to the desired voltage level of about 3.0V. Similarly, due to relation between the frequency and the duty cycle of the pump device 210, duty cycle of the pump device 210 and the second reference voltage level Vref2 have a negative correlation.

Figure 5:
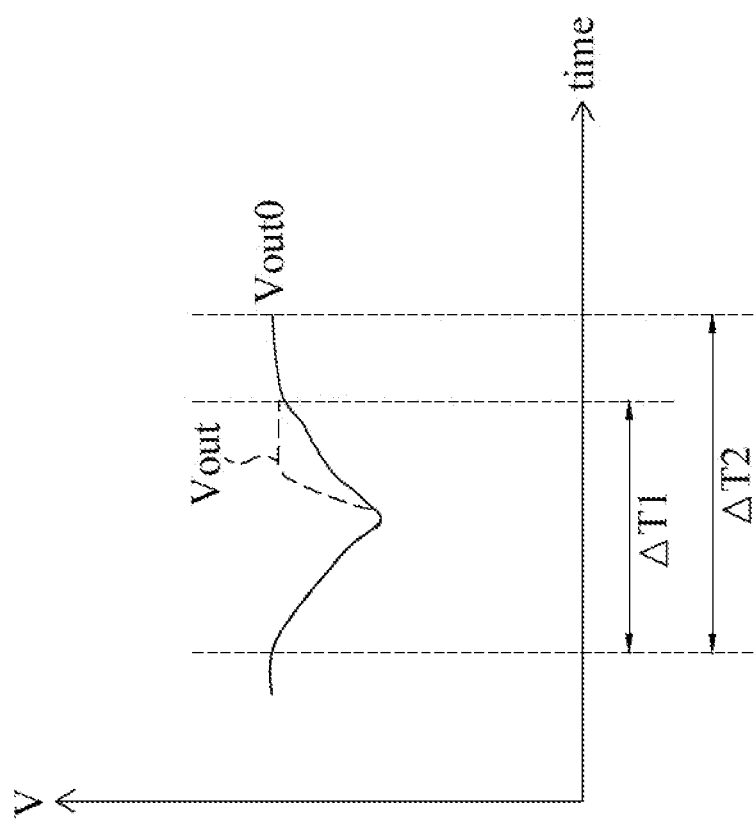
FIG. 5 is a wave diagram illustrating recovery time required by the voltage systems of FIGS. 1 and 2, in accordance with an embodiment of the present disclosure.

FIG. 5 is a wave diagram illustrating recovery time required for the voltage system 10 of FIG. 1 and the voltage system 20 of FIG. 2, in accordance with an embodiment of the present disclosure. Referring to FIG. 5, the horizontal axis represents timing and the vertical axis represents voltage. By using the voltage system 20 of FIG. 2, the recovery time ΔT1 is kept relatively short. In comparison, by using the voltage system 10 of FIG. 1, the recovery time ΔT2 is relatively long. As a result, as observed from FIG. 5, it can be realized that only a relatively short length of time is required to adjust the supply voltage Vpump of the voltage system 20 from a drastically reduced voltage level back to a desired voltage level.

Figure 6:
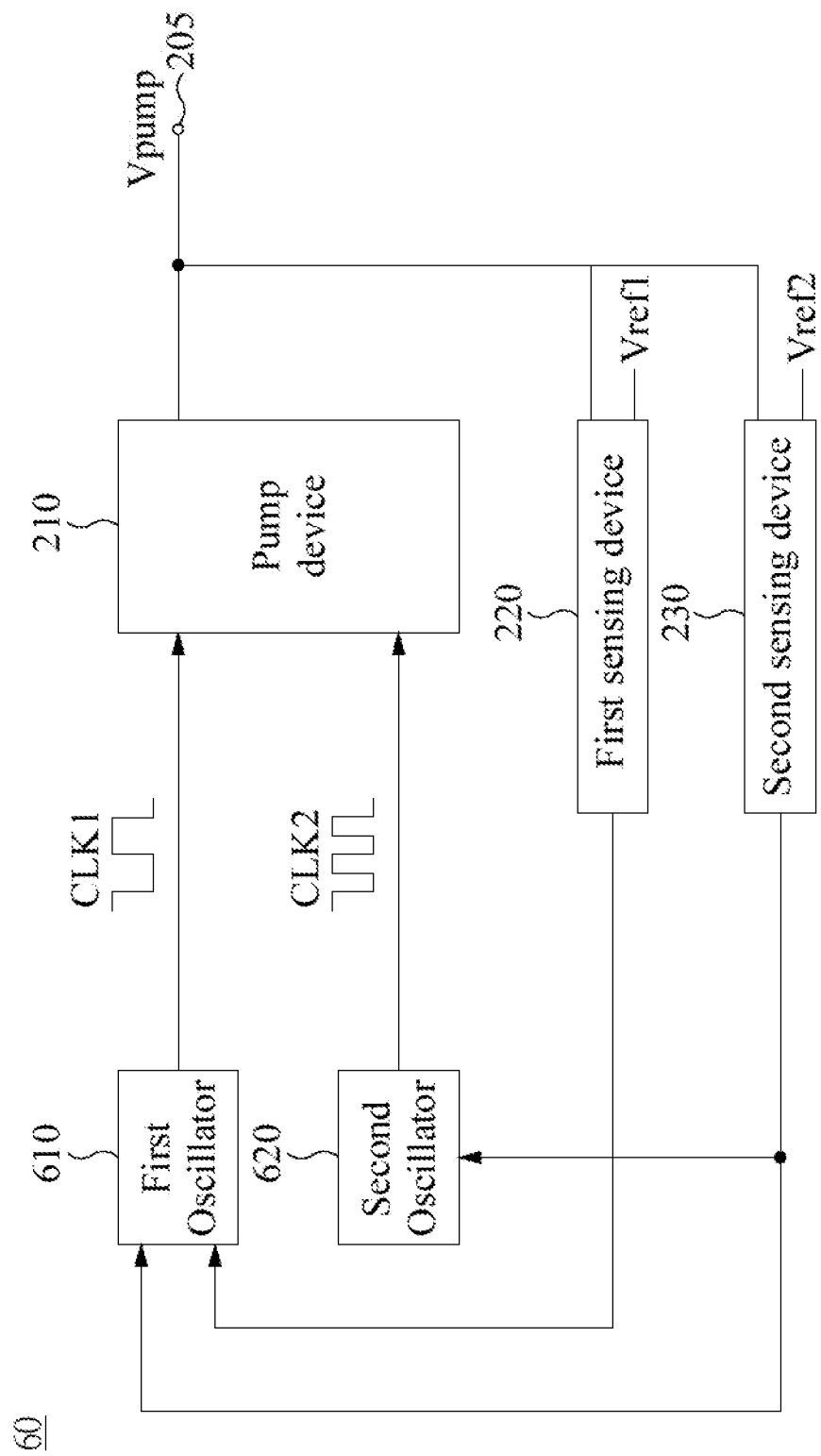
FIG. 6 is a block diagram of a voltage system, in accordance with an embodiment of the present disclosure.

FIG. 6 is a block diagram of a voltage system 60, in accordance with an embodiment of the present disclosure. Referring to FIG. 6, the voltage system 60 is similar to the voltage system described and illustrated with reference to FIG. 2 except that, for example, the voltage system 60 includes a first oscillator 610 and a second oscillator 620 independent of each other.

The first oscillator 610 has one fixed frequency, which means that the first oscillator 610 is not able to provide a variety of frequency, and functions to provide an oscillation signal exhibiting a first frequency CLK1, which will be described in detail with reference to FIG. 7.

Moreover, the first oscillator 610 includes the same operation performed by the oscillator 200 described and illustrated with reference to FIG. 2. In further detail, the first oscillator 610 functions to be either activated or deactivated by the first sensing device 220, and provides the oscillation signal to the pump device 210 when the first oscillator 610 is activated.

In an embodiment, the first oscillator 610 includes a voltage-controlled oscillator (VCO) or a digitally-controlled oscillator (DCO). In an embodiment, the first oscillator 610 includes a ring oscillator. In an embodiment, the first oscillator 610 includes an inductor-capacitor (LC) oscillator.

The second oscillator 620 has one fixed frequency, and functions to provide an oscillation signal exhibiting a second frequency CLK2 greater than the first frequency CLK1, thereby decreasing time for increasing the voltage level of the supply voltage Vpump back to the desired voltage level, as will be described in detail with reference to FIG. 8.

In an embodiment, the second oscillator 620 includes a voltage-controlled oscillator (VCO) or a digitally-controlled oscillator (DCO). In an embodiment, the second oscillator 620 includes a ring oscillator. In an embodiment, the second oscillator 620 includes an inductor-capacitor (LC) oscillator.

Figure 7:
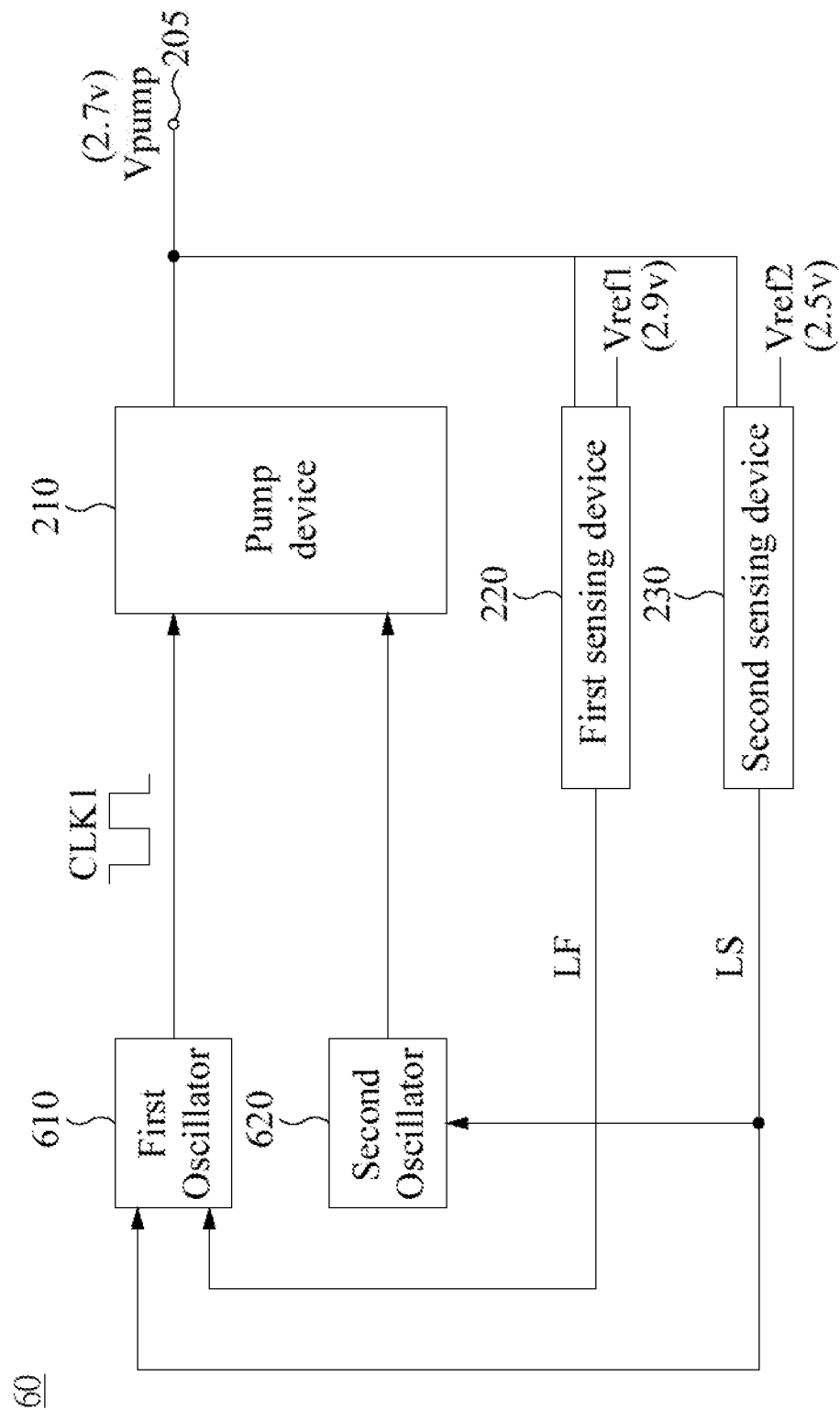
FIG. 7 is a block diagram illustrating an operation of the voltage system of FIG. 6, in accordance with an embodiment of the present disclosure.

FIG. 7 is a block diagram illustrating an operation of the voltage system 60 of FIG. 6, in accordance with an embodiment of the present disclosure. Referring to FIG. 7, a scenario in which the voltage level of the supply voltage Vpump is slightly reduced from the desired voltage level of about 3.0V to a voltage level of about 2.7V is illustrated. For the sake of describing the operation of FIG. 7, it is assumed that the first reference voltage level Vref1 is about 2.9V, and the second reference voltage level Vref2 is about 2.5V.

The first sensing device 220 compares the voltage level of about 2.7V to the first reference voltage level Vref1 of about 2.9V. Similarly, the second sensing device 230 compares the voltage level of about 2.7V to the second reference voltage level Vref2 of about 2.5V.

The first oscillator 610 receives the comparison results LF and LS from the first sensing device 220 and the second sensing device 230. The first oscillator 610 is activated by the first sensing device 220 when the sensing result LF from the first sensing device 220 indicates that the voltage level of about 2.7V is less than the first reference voltage level Vref1 of about 2.9V. Moreover, the first oscillator 610 provides the oscillation signal exhibiting the first frequency CLK1 when the comparison result LS from the second sensing device 230 indicates that the voltage level of 2.7V is greater than the second reference voltage level Vref2 of 2.5V. Alternatively, the first oscillator 610 is deactivated when the voltage level of the supply voltage Vpump of, for example, 3.0V is greater than the first reference voltage level Vref1 of 2.9V.

The second oscillator 620 receives the comparison result LS from the second sensing device 230. The second oscillator 620 is deactivated by the second sensing device 230 when the sensing result LS from the second sensing device 230 indicates that the voltage level of about 2.7V is greater than the second reference voltage level Vref2 of about 2.5V.

The pump device 210 functions to provide the supply voltage Vpump, based on the first frequency CLK1 of the oscillation signal received, by performing a charging operation on the capacitor coupled to the output 205 of the voltage system 60.

Figure 8:
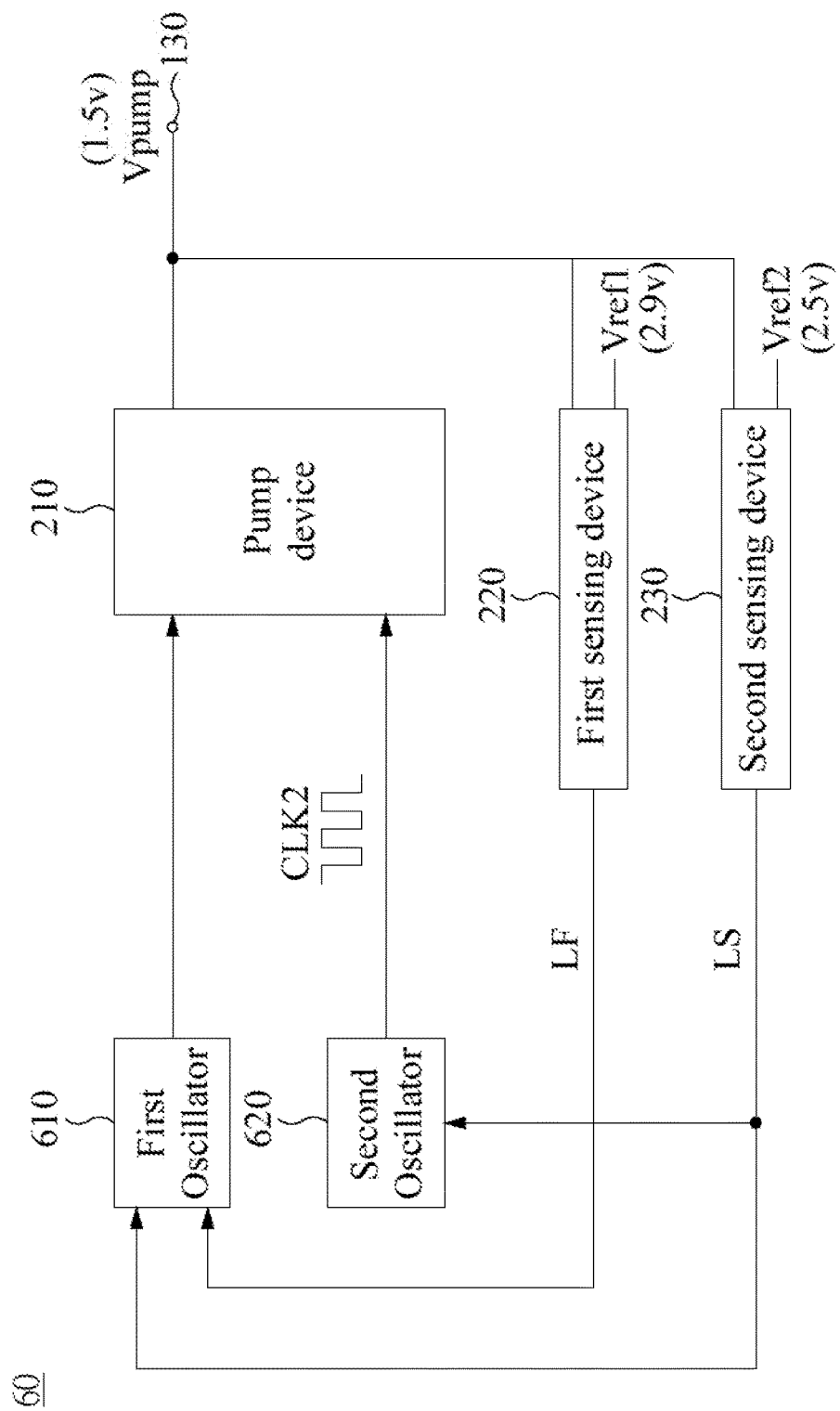
FIG. 8 is a block diagram illustrating another operation of the voltage system of FIG. 6, in accordance with an embodiment of the present disclosure.

FIG. 8 is a block diagram illustrating another operation of the voltage system 60 of FIG. 6, in accordance with an embodiment of the present disclosure. Referring to FIG. 8, a scenario in which the voltage level of the supply voltage Vpump is drastically reduced from the desired voltage level of about 3.0V to a voltage level of about 1.5V is illustrated. For the sake of describing the operation of FIG. 8, it is assumed that the first reference voltage level Vref1 is about 2.9V, and the second reference voltage level Vref2 is about 2.5V. In an example of the scenario, the supply voltage Vpump serves as a supply voltage for a load. When an operation mode of the load is changed from a light-load mode to a heavy-load mode, the supply voltage Vpump may drop drastically, for example, from about 3.0V to about 1.5V, which is less than not only the first reference voltage level Vref1 of about 2.9V but also the second reference voltage level Vref2 of 2.5V.

The first sensing device 220 compares the voltage level of about 1.5V to the first reference voltage level Vref1 of about 2.9V. Similarly, the second sensing device 230 compares the voltage level of about 1.5V to the second reference voltage level Vref2 of about 2.5V.

The first oscillator 610 receives the comparison results LF and LS from the first sensing device 220 and the second sensing device 230. The first oscillator 610 is deactivated by one of the first sensing device 220 and the second sensing device 230 when the sensing result LS from the second sensing device 230 indicates that the voltage level of about 1.5V is less than the first reference voltage level Vref1 of about 2.9V.

The second oscillator 620 receives the comparison result LS from the second sensing device 230. The second oscillator 620 is activated by the second sensing device 230 when the sensing result LS from the second sensing device 230 indicates that the voltage level of about 1.5V is less than the first reference voltage level Vref1 of about 2.9V. Moreover, the second oscillator 620 provides the oscillation signal exhibiting the relatively high second frequency CLK2 when the comparison result LS from the second sensing device 230 indicates that the voltage level of 1.5V is less than the second reference voltage level Vref2 of 2.5V.

As previously mentioned, frequency of the oscillation signal relates to a time for increasing the voltage level of the supply voltage Vpump. Therefore, when the pump device 210 receives the oscillation signal exhibiting the relatively high second frequency CLK2, a relatively short time is required for the pump device 210 to increase the supply voltage Vpump from a drastically reduced voltage level of about 1.5V back to a desired voltage level of about 3.0V.

Figure 9:
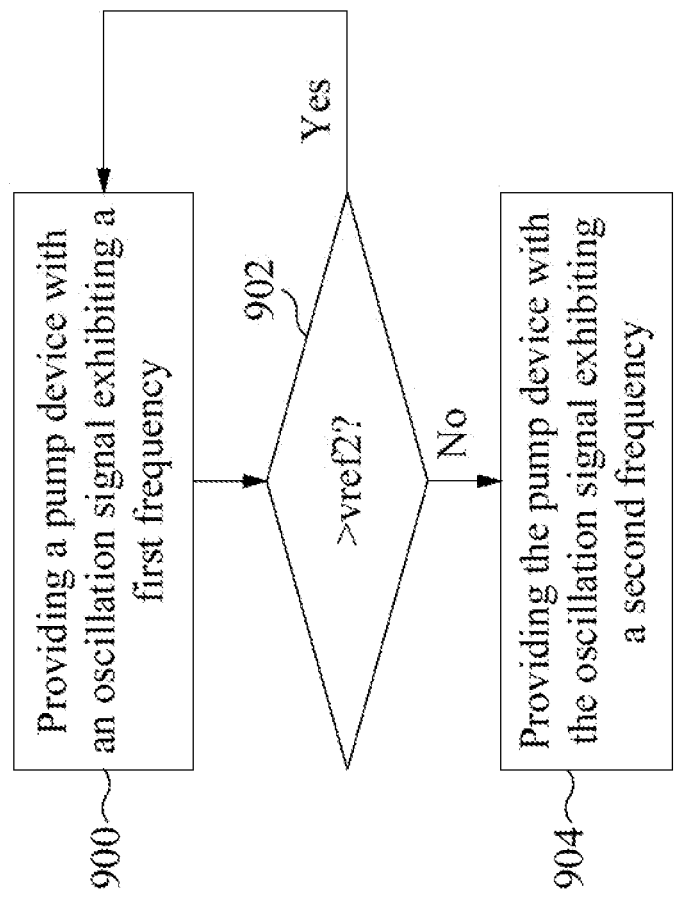
FIG. 9 is a flow diagram of a method of operating a voltage system, in accordance with an embodiment of the present disclosure.

FIG. 9 is a flow diagram of a method 90 of operating a voltage system, in accordance with an embodiment of the present disclosure. Referring to FIG. 9, the method 90 includes operations 900, 902 and 904.

The method 90 begins with operation 900, in which a pump device, which functions to provide a supply voltage, is provided with an oscillation signal exhibiting a first frequency.

The method 90 proceeds to operation 902, in which it is determined whether a voltage level of the supply voltage is greater than a reference voltage level (such as the second reference voltage level Vref2 shown in FIG. 2). If affirmative, the method 90 returns to operation 900. If negative, the method 90 proceeds to operation 904, in which the pump device is provided with the oscillation signal exhibiting a second frequency greater than the first frequency.

In the present disclosure, the oscillator 200 provides the oscillation signal exhibiting the relatively high second frequency CLK2 when the comparison result LS from the second sensing device 230 indicates that the voltage level of 1.5V is less than the second reference voltage level Vref2 of 2.5V. Since frequency of the oscillation signal relates to a time for increasing the voltage level of the supply voltage Vpump, when the pump device 210 receives the oscillation signal exhibiting the relatively high second frequency CLK2, a relatively short time is required for the pump device 210 to increase the supply voltage Vpump from a drastically reduced voltage level of about 1.5V back to a desired voltage level of about 3.0V.

In contrast, in the comparative voltage system, in a scenario, the supply voltage Vpump0 of the voltage system 10 may drop drastically. In such scenario, the oscillator 100 still provides the oscillation signal CLK0 with the same frequency as in a circumstance in which the voltage level of the supply voltage Vpump0 is slightly reduced, for example, from about 3.0V to about 2.8V. Because frequency of the oscillation signal CLK0 is related to a time for increasing the voltage level of the supply voltage Vpump0, in that case a relatively long time is required to increase the supply voltage Vpump0 from a drastically reduced voltage level of about 1.5V back to a desired voltage level of about 3.0V.

One aspect of the present disclosure provides a voltage system. The voltage system includes an oscillator and a pump device. The oscillator is configured to provide an oscillation signal exhibiting a first frequency when a voltage level of a supply voltage is greater than a reference voltage level, and provide the oscillation signal exhibiting a second frequency greater than the first frequency when the voltage level of the supply voltage is less than the reference voltage level. The pump device is configured to provide the supply voltage, based on a frequency of the oscillation signal provided by the oscillator, by performing a charging operation.

Another aspect of the present disclosure provides a voltage system. The voltage system includes a first oscillator, a second oscillator and a pump device. The first oscillator, which has one fixed frequency, is configured to provide an oscillation signal exhibiting a first frequency when a voltage level of a supply voltage is greater than a reference voltage level. The second oscillator, which has one fixed frequency and is independent of the first oscillator, is configured to provide an oscillation signal exhibiting a second frequency greater than the first frequency when the voltage level of the supply voltage is less than the reference voltage level. The pump device is configured to provide the supply voltage, based on a frequency of an oscillation signal received, by performing a charging operation.

Another aspect of the present disclosure provides a method of operating a voltage system. The method includes providing a pump device with an oscillation signal exhibiting a first frequency until a supply voltage provided by the pump device is less than a reference voltage level; and providing the pump device with the oscillation signal exhibiting a second frequency when the supply voltage is less than the reference voltage level.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, and composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A voltage system, comprising:
an oscillator configured to provide an oscillation signal exhibiting a first frequency when a voltage level of a supply voltage is greater than a reference voltage level, and to provide the oscillation signal exhibiting a second frequency greater than the first frequency when the voltage level of the supply voltage is less than the reference voltage level; and
a pump device configured to provide the supply voltage, based on a frequency of the oscillation signal provided by the oscillator, by performing a charging operation;
the reference voltage level being a second reference voltage level, wherein the oscillator is deactivated when the voltage level of the supply voltage is greater than a first reference voltage level greater than the second reference voltage level;
wherein the oscillator provides the oscillation signal exhibiting the first frequency when the voltage level of the supply voltage is less than the first reference voltage level and greater than the second reference voltage level.

2. The voltage system of claim 1, wherein the frequency of the oscillation signal and the reference voltage level have a negative correlation.

3. The voltage system of claim 1, wherein duty cycle of the pump device and the reference voltage level have a negative correlation.

4. The voltage system of claim 1, further comprising:
a sensing device configured to compare the voltage level of the supply voltage to the reference voltage level;
wherein the oscillator is configured to provide the oscillation signal exhibiting the second frequency when the comparison result from the sensing device indicates that the voltage level of the supply voltage is less than the reference voltage level.

5. The voltage system of claim 4, wherein the oscillator is configured to receive the comparison result from the sensing device.

6. A voltage system, comprising:
an oscillator configured to provide an oscillation signal exhibiting a first frequency when a voltage level of a supply voltage is greater than a reference voltage level, and to provide the oscillation signal exhibiting a second frequency greater than the first frequency when the voltage level of the supply voltage is less than the reference voltage level;
a pump device configured to provide the supply voltage, based on a frequency of the oscillation signal provided by the oscillator, by performing a charging operation; and
a sensing device configured to compare the voltage level of the supply voltage to the reference voltage level;
wherein the oscillator is configured to provide the oscillation signal exhibiting the second frequency when the comparison result from the sensing device indicates that the voltage level of the supply voltage is less than the reference voltage level;
wherein the sensing device is a second sensing device and the reference voltage level is a second reference voltage level, the voltage system further comprising:
a first sensing device configured to compare the voltage level of the supply voltage to a first reference voltage level greater than the second reference voltage level;
the oscillator configured to provide the oscillation signal exhibiting the first frequency when the sensing result from the first sensing device indicates that the voltage level of the supply voltage is less than the first reference voltage level and the comparison result from the second sensing device indicates that the voltage level of the supply voltage is greater than the second reference voltage level.

7. The voltage system of claim 6, wherein the oscillator is configured to receive the comparison result from the first sensing device.

8. A voltage system, comprising:
a first oscillator, which has one fixed frequency, configured to provide an oscillation signal exhibiting a first frequency when a voltage level of a supply voltage is greater than a reference voltage level;
a second oscillator, which has one fixed frequency and is independent of the first oscillator, configured to provide an oscillation signal exhibiting a second frequency greater than the first frequency when the voltage level of the supply voltage is less than the reference voltage level;
a pump device configured to provide the supply voltage, based on a frequency of an oscillation signal received, by performing a charging operation; and
a sensing device configured to compare the voltage level of the supply voltage to the reference voltage level;
wherein the second oscillator is configured to provide the oscillation signal exhibiting the second frequency when the comparison result from the sensing device indicates that the voltage level of the supply voltage is less than the reference voltage level;
wherein the sensing device is a second sensing device and the reference voltage level is a second reference voltage level, the voltage system further comprising:
a first sensing device configured to compare the voltage level of the supply voltage to a first reference voltage level greater than the second reference voltage level;
wherein the first oscillator is configured to provide the oscillation signal exhibiting the first frequency when the sensing result from the first sensing device indicates that the voltage level of the supply voltage is less than the first reference voltage level and the comparison result from the second sensing device indicates that the voltage level of the supply voltage is greater than the second reference voltage level.

9. The voltage system of claim 8, wherein the frequency of the oscillation signal received and the reference voltage level have a negative correlation.

10. The voltage system of claim 8, wherein duty cycle of the pump device and the reference voltage level have a negative correlation.

11. The voltage system of claim 8, wherein the second oscillator is deactivated when the voltage level of the supply voltage is greater than the reference voltage level.

12. The voltage system of claim 11, wherein the first oscillator is deactivated when the voltage level of the supply voltage is less than the reference voltage level.

13. The voltage system of claim 8, wherein the second oscillator is configured to receive the comparison result from the sensing device.

14. The voltage system of claim 8, wherein the first oscillator is configured to receive the comparison result from the first sensing device.

* * * * *